United States Patent
Raghu

(10) Patent No.: US 7,371,333 B2
(45) Date of Patent: May 13, 2008

(54) METHODS OF ETCHING NICKEL SILICIDE AND COBALT SILICIDE AND METHODS OF FORMING CONDUCTIVE LINES

(75) Inventor: Prashant Raghu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 243 days.

(21) Appl. No.: 11/146,648

(22) Filed: Jun. 7, 2005

(65) Prior Publication Data

US 2006/0276048 A1    Dec. 7, 2006

(51) Int. Cl.
B44C 1/22    (2006.01)
(52) U.S. Cl. .................. 216/83; 438/649; 438/651; 438/682; 438/710; 438/721; 438/745; 438/754; 216/83
(58) Field of Classification Search ............... 438/745; 216/83
See application file for complete search history.

(56) References Cited

U.S. PATENT DOCUMENTS

| | | | |
|---|---|---|---|
| 5,879,974 A | | 3/1999 | Yamazaki |
| 5,933,757 A | * | 8/1999 | Yoshikawa et al. ......... 438/682 |
| 6,074,960 A | * | 6/2000 | Lee et al. .................... 438/749 |
| 6,362,095 B1 | * | 3/2002 | Woo et al. ................... 438/649 |
| 6,589,884 B1 | | 7/2003 | Torek |
| 7,122,410 B2 | * | 10/2006 | Kammler et al. ............ 438/154 |

| | | | |
|---|---|---|---|
| 2002/0164843 A1 | | 11/2002 | Yamazaki |

FOREIGN PATENT DOCUMENTS

| | | |
|---|---|---|
| EP | 0 219 827 A2 | 10/1986 |
| EP | 0219827 | 4/1987 |
| EP | 0 750 338 A2 | 6/1996 |
| EP | 0750338 | 12/1996 |
| JP | 11-54455 | 2/1999 |
| JP | 11054455 | 2/1999 |
| WO | 2006/019693 | 5/2006 |

OTHER PUBLICATIONS

S.J. Pearton, Journal of Vacuum Science & Technology, vol. A 11(4), Jul./Aug. (1993), pp. 1772-1775.*
S. Wolf, Silicon Processing for the VLSI Era, vol. 1, Lattice Press (1986), pp. 516-517.*
US06/196393 Jan. 18, 2007 PCT International Search Report.
US06/196393 Jan. 18, 2007 PCT Written Opinion.
US06/196393 Mar. 19, 2007 Response to Written Opinion.

* cited by examiner

Primary Examiner—Binh X. Tran
Assistant Examiner—Maki Angadi
(74) Attorney, Agent, or Firm—Wells St. John P.S.

(57) ABSTRACT

The invention includes methods of etching nickel silicide and cobalt silicide, and methods of forming conductive lines. In one implementation, a substrate comprising nickel silicide is exposed to a fluid comprising $H_3PO_4$ and $H_2O$ at a temperature of at least 50° C. and at a pressure from 350 Torr to 1100 Torr effective to etch nickel silicide from the substrate. In one implementation, at least one of nickel silicide or cobalt silicide is exposed to a fluid comprising $H_2SO_4$, $H_2O_2$, $H_2O$, and HF at a temperature of at least 50° C. and at a pressure from 350 Torr to 1100 Torr effective to etch the at least one of nickel silicide or cobalt silicide from the substrate.

62 Claims, 5 Drawing Sheets

METHODS OF ETCHING NICKEL SILICIDE AND COBALT SILICIDE AND METHODS OF FORMING CONDUCTIVE LINES

TECHNICAL FIELD

This invention relates to methods of etching nickel silicide and cobalt silicide, and to methods of forming conductive lines.

BACKGROUND OF THE INVENTION

In integrated circuitry fabrication, some electrically conductive lines are fabricated to interconnect various devices and some to form gates of field effect transistors. Such lines and gates might be formed of one or more conductive materials, including conductively doped semiconductive materials such as conductively doped polysilicon. One type of conductive material utilized in such conductive lines, with or without conductively doped polysilicon, are conductive metal silicides. It would be desirable to develop etching chemistries which etch different and certain conductive metal silicides.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of etching nickel silicide and cobalt silicide, and methods of forming conductive lines. In one implementation, a substrate comprising nickel silicide is exposed to a fluid comprising $H_3PO_4$ and $H_2O$ at a temperature of at least 50° C. and at a pressure from 350 Torr to 1100 Torr effective to etch nickel silicide from the substrate.

In one implementation, at least one of nickel silicide and cobalt silicide is exposed to a fluid comprising $H_2SO_4$, $H_2O_2$, $H_2O$, and HF at a temperature of at least 50° C. and at a pressure from 350 Torr to 1100 Torr effective to etch the at least one of nickel silicide and cobalt silicide from the substrate.

In one implementation, a method of forming a nickel silicide-comprising conductive line includes forming a silicon-comprising line having undoped silicon dioxide received laterally over opposing sides thereof. Elemental nickel is deposited over the silicon-comprising line and over the undoped silicon dioxide. The elemental nickel and silicon of the line are annealed effective to form a nickel silicide-comprising line. The nickel silicide is etched selectively relative to the undoped silicon dioxide using a fluid comprising $H_3PO_4$ and $H_2O$ at a temperature of at least 50° C. and at a pressure from 350 Torr to 1100 Torr effective to recess the nickel silicide-comprising line relative to the undoped silicon dioxide.

In one implementation, a method of forming a conductive line comprising at least one of nickel silicide or cobalt silicide includes forming a silicon-comprising line having at least one of silicon nitride or undoped silicon dioxide received laterally over opposing sides thereof. At least one of elemental nickel or elemental cobalt is deposited over the silicon-comprising line and over the at least one of silicon nitride or undoped silicon dioxide. The at least one of elemental nickel or the elemental cobalt and silicon of the line are annealed effective to form at least one of a nickel silicide-comprising line or a cobalt silicide-comprising line. The at least one of a nickel silicide-comprising line or a cobalt silicide-comprising line is etched with a fluid comprising $H_2SO_4$, $H_2O_2$, $H_2O$, and HF at a temperature of at least 50° C. and at a pressure from 350 Torr to 1100 Torr selective to the at least one of silicon nitride or undoped silicon dioxide effective to recess the at least one of a nickel silicide-comprising line or a cobalt silicide-comprising line relative to the at least one of silicon nitride or undoped silicon dioxide.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
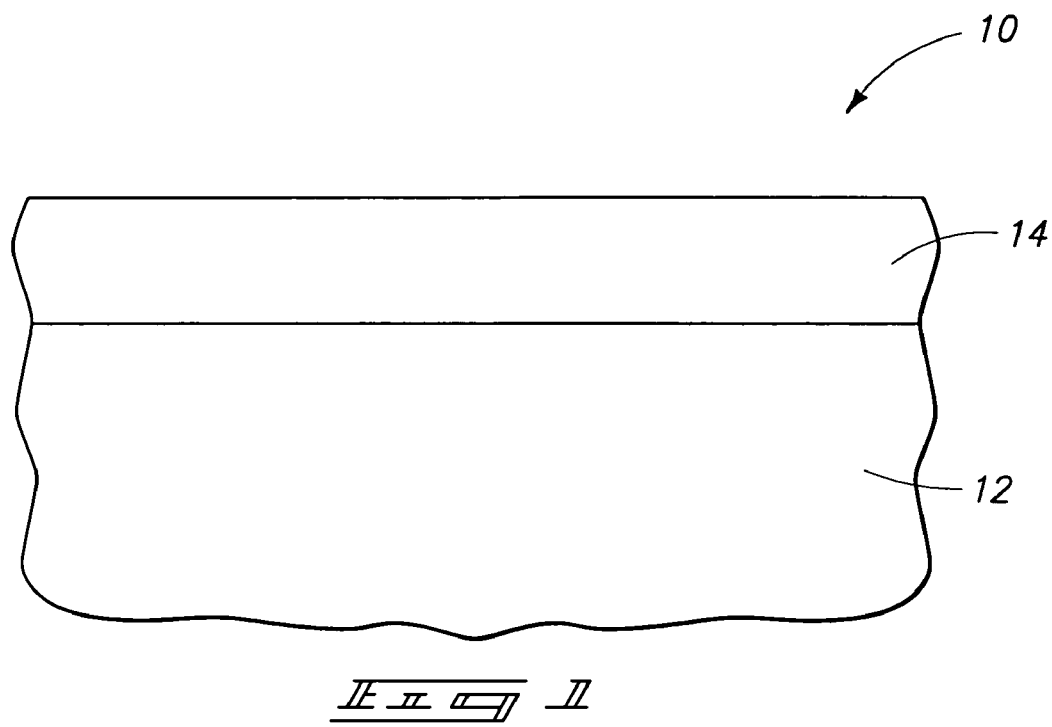
FIG. 1 is a diagrammatic sectional view of a semiconductor substrate fragment in process in accordance with an aspect of the invention.

In one implementation, the invention encompasses methods of etching nickel silicide material. First exemplary implementations of the same are described, by way of example only, with respect to FIGS. 1 and 2. FIG. 1 depicts a substrate fragment indicated generally with reference numeral 10. Such preferably comprises a semiconductor substrate, with FIG. 1 depicting an exemplary bulk monocrystalline silicon substrate 12 having a nickel silicide material 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The substrate of FIG. 1 is exemplary only, and any conceivable substrate is contemplated, whether existing or yet-to-be developed. Nickel silicide might be stoichiometric or non-stoichiometric, with $NiSi_x$, where "x" ranges from 1 to 2, being exemplary compositions.

Figure 2:
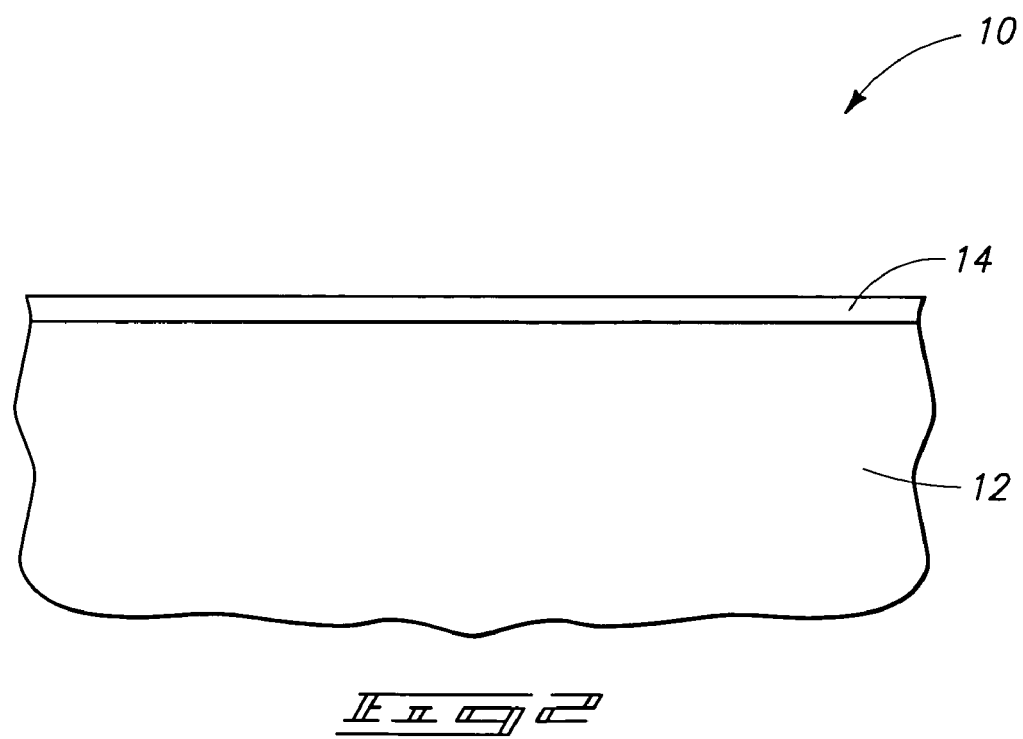
FIG. 2 is a view of the FIG. 1 substrate fragment at a processing step subsequent to that shown by FIG. 1.

Referring to FIG. 2, substrate 10 comprising nickel silicide 14 has been exposed to a fluid comprising $H_3PO_4$ and $H_2O$ at a temperature of at least 50° C. and at a pressure of from 350 Torr to 1110 Torr effective to etch nickel silicide 14 from substrate 10. Of course, such etching might remove all exposed nickel silicide material from the substrate, or might only be partial as depicted in FIG. 2. Further by way of example only, some of material 14 might be masked during exposure to such fluid. Most preferably, the fluid is predominantly liquid, including 100% liquid. Temperature is more preferably at least 100° C., with an even more preferred temperature range being from 135° C. to 155° C. A more preferred pressure range is from 600 Torr to 900 Torr, with the invention being reduced-to-practice at a temperature of 145° C. and at atmospheric pressure.

In one preferred implementation, the fluid consists essentially of $H_3PO_4$ and $H_2O$. A preferred concentration of $H_3PO_4$ is from 65 volume percent to 90 volume percent of the fluid, with from 80 volume percent to 90 volume percent being more preferred, and a concentration of about 85 volume percent (i.e., +/− 0.5 percent) being a specific preferred example. $H_2O$ is preferably present in the fluid at from 35 volume percent to 10 volume percent, more preferably at from 20 volume percent to 10 volume percent, with about 15 volume percent (i.e., +/− 0.5 percent) being a specific preferred example. In one specific example, a layer consisting essentially of $NiSi_2$ was etched at a rate of 15 Angstroms per minute in a liquid consisting essentially of $H_3PO_4$ and $H_2O$, at 85 volume percent $H_3PO_4$ and 15 volume percent $H_2O$, at 140° C. and atmospheric pressure (760 Torr).

In one implementation, the substrate being etched might comprise at least one of exposed undoped silicon dioxide or exposed elemental silicon during at least some portion of the etching. In the context of this document, silicon dioxide is "undoped" if it has from zero to no greater than 0.5 atomic percent of one or each of boron or phosphorus. Further in one implementation in such instance, the etching is preferably selective to the at least one of exposed undoped silicon dioxide or exposed elemental silicon. In the context of this document, selective or selectivity is defined as removal of one material relative to another at a rate of at least 2:1.

Figure 3:
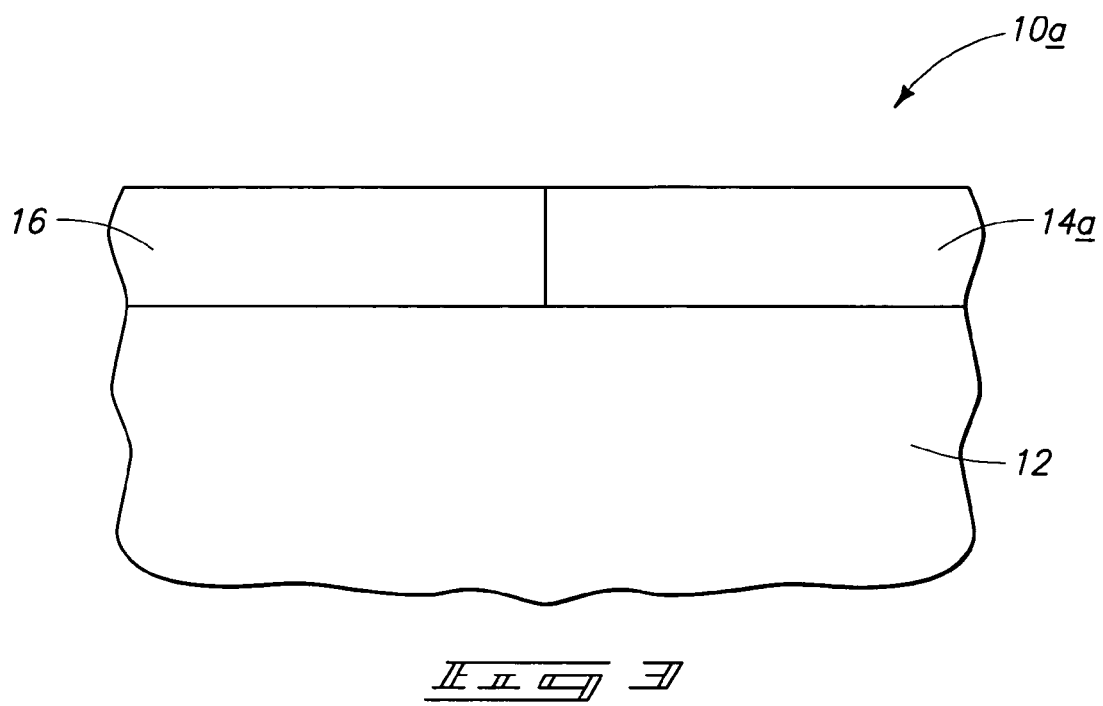
FIG. 3 is a diagrammatic sectional view of an alternate embodiment semiconductor substrate fragment in process in accordance with an aspect of the invention.
Figure 4:
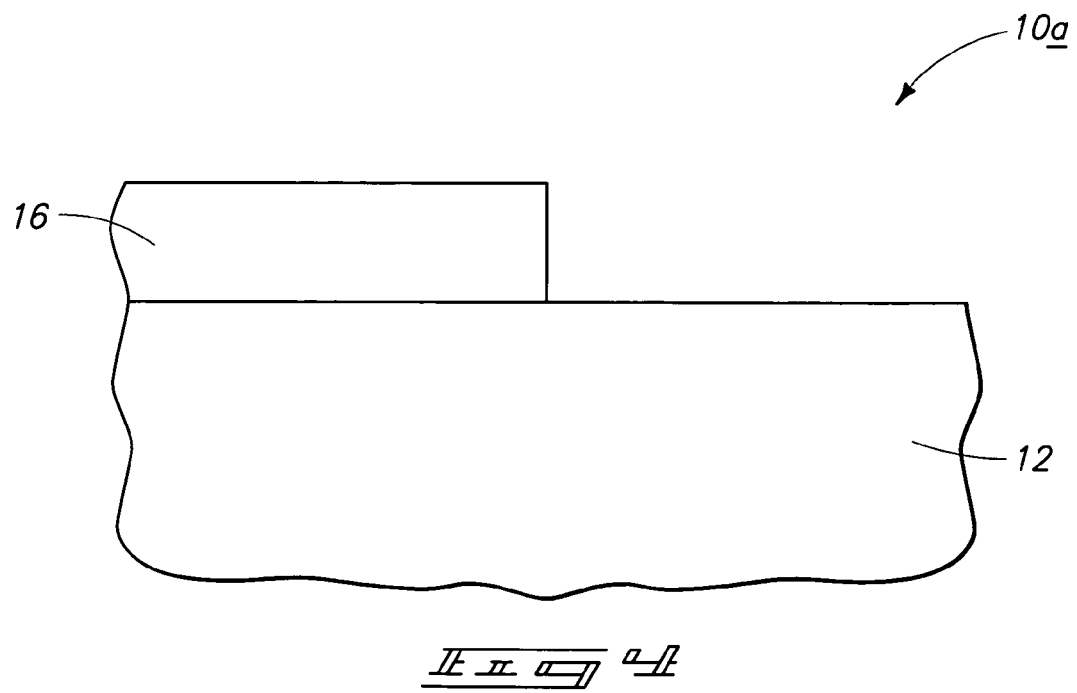
FIG. 4 is a view of the FIG. 3 substrate fragment at a processing step subsequent to that shown by FIG. 3.

For example and by way of example only, an alternate exemplary embodiment is described in FIGS. 3 and 4 with respect to a substrate fragment 10a. Like numerals from the first-described embodiment have been utilized where appropriate, with differences being indicated with the suffix "a", or with different numerals. Referring to FIG. 3, a metal silicide-comprising layer 14a and another layer 16 are shown received laterally proximate one another over base substrate 12. Material 16 comprises at least one of undoped silicon dioxide or elemental silicon which, at some point during the etch of material 14a, is outwardly exposed to the etching fluid. Such exposure might be at the beginning of the etch, or at some point during the etch not necessarily at the beginning.

Referring to FIG. 4, nickel silicide 14a (not shown) has been exposed to a fluid comprising $H_3PO_4$ and $H_2O$ at a temperature of at least 50° C. and a pressure from 350 Torr to 1100 Torr effective to etch nickel silicide from the substrate. Preferred processing is otherwise as described above in connection with the first-described embodiment. By way of example only, FIG. 4 depicts the complete etching of nickel silicide 14a from over base substrate 12. Of course, less-than-complete etching is also contemplated. Preferably, the selectivity to the at least one of exposed undoped silicon dioxide or exposed elemental silicon is at a removal rate/selectivity of at least 10:1 (rate of removal of nickel silicide to any of exposed undoped silicon dioxide or elemental silicon), and even more preferably at a removal rate of at least 100:1. In the above-described reduction-to-practice example, the etch rate of an undoped thermal oxide layer was at about 0.1 Angstroms per minute in comparison to the 15 Angstroms per minute etch rate of the nickel silicide, thus giving an exemplary selectivity of 150:1.

In one aspect, the invention also contemplates a method of etching at least one of nickel silicide or cobalt silicide. The nickel silicide and/or cobalt silicide might be stoichiometric or non-stoichiometric, with $NiSi_x$ and $CoSi_x$ where "x" ranges from 1 to 2, being exemplary compositions. For example and by way of example only, either of materials 14 and 14a in the above-described embodiments might comprise one or a combination of nickel silicide and/or cobalt silicide. Etching such material in accordance with one implementation of the invention encompasses exposing a substrate comprising at least one of nickel silicide or cobalt silicide to a fluid comprising $H_2SO_4$, $H_2O_2$, $H_2O$, and HF at a temperature of at least 50° C. and at a pressure from 350 Torr to 1100 Torr effective to etch the at least one of nickel silicide or cobalt silicide from the substrate.

Most preferably, the fluid predominantly comprises liquid, including 100% liquid. Further preferably, the temperature is at least 100° C. and a more preferred pressure range is from 600 Torr to 900 Torr. In one implementation, the fluid preferably consists essentially of $H_2SO_4$, $H_2O_2$, $H_2O$, and HF. In one implementation, HF is present in the fluid relative to a sum of $H_2SO_4$, $H_2O_2$ and $H_2O$ at a volumetric ratio of from 0.0005:1 to 0.1:1, and even more preferably where such volumetric ratio is from 0.001:1 to 0.002:1. Further and regardless, in one preferred implementation the $H_2SO_4$ is present in the fluid relative to $H_2O_2$ at a volumetric ratio of from 20:1 to 40:1, with a more preferred such volumetric ratio being from 30:1 to 35:1. Further and regardless, in one preferred implementation $H_2O$ is present in the fluid relative to a sum of the $H_2SO_4$ and $H_2O_2$ at a volumetric ratio of from 0.03:1 to 1:1, with a more preferred such volumetric ratio being from 0.05:1 to 0.07:1.

In one preferred implementation, the substrate being etched might comprise at least one of exposed undoped silicon dioxide, exposed elemental silicon, or exposed silicon nitride during at least some portion of the etching with the fluid comprising $H_2SO_4$, $H_2O_2$, $H_2O$, and HF. Preferably in such implementation, such etching is selective to at least one of exposed undoped silicon dioxide, exposed elemental silicon, or exposed silicon nitride. Such selectivity is even more preferably at a removal rate of the silicide relative to the undoped silicon dioxide, elemental silicon or silicon nitride of at least 10:1, and even more preferably at a removal rate of at least 100:1. In one specific example, the fluid was liquid and comprised volumetric ratios of $HF:H_2SO_4:H_2O_2:H_2O$ at 1:910:27:56. The fluid temperature during the etching was 100° C., and the etching was conducted at atmospheric pressure (760 Torr). Undoped, thermally grown silicon as well as nickel silicide ($NiSi_2$) were exposed during such etching. Such etching resulted in a removal rate of the nickel silicide at greater than or equal to 70 Angstroms per minute, with the removal of the undoped silicon dioxide occurring at 6.3 Angstroms per minute.

Figure 5:
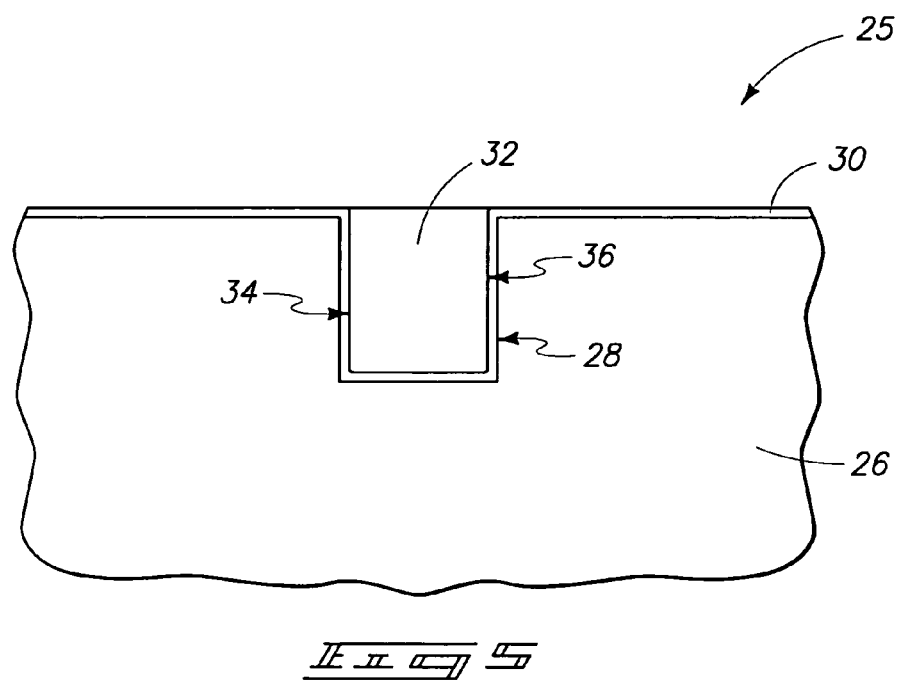
FIG. 5 is a diagrammatic sectional view of another semiconductor substrate fragment in process in accordance with an aspect of the invention, and is taken through line 5-5 in FIG. 6.
Figure 6:
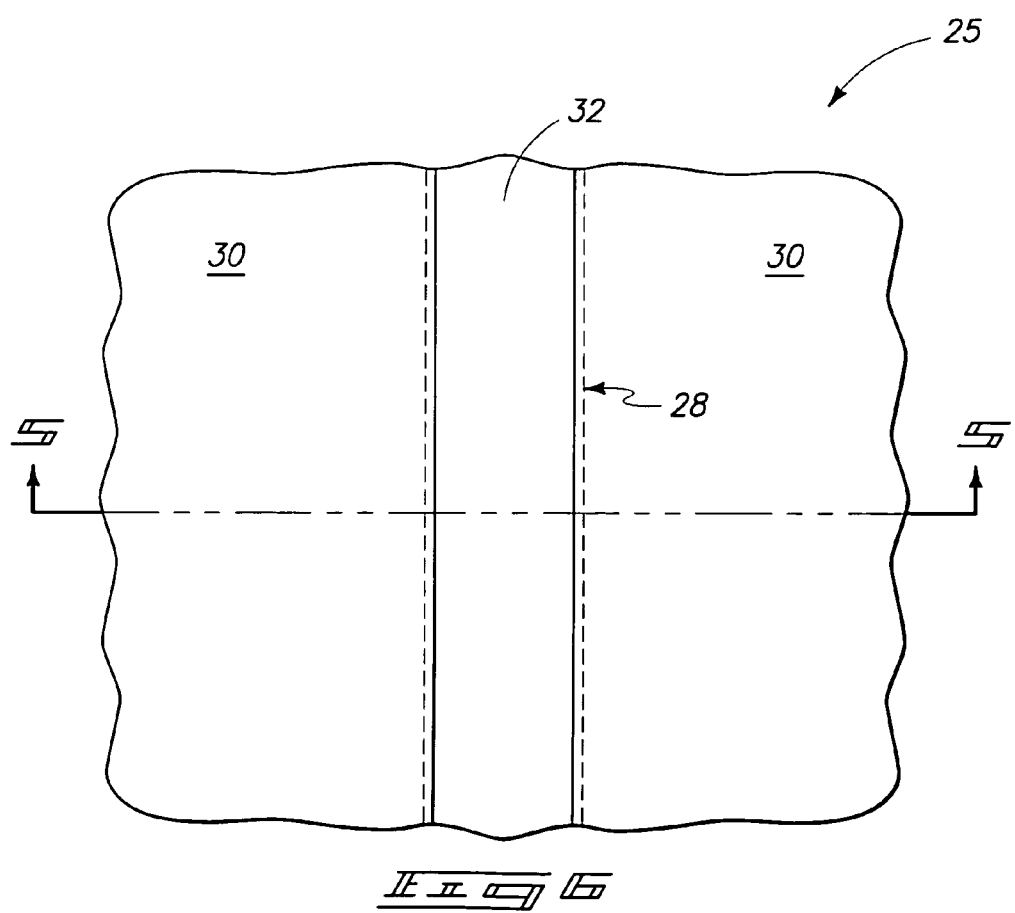
FIG. 6 is a top plan view of the FIG. 5 substrate fragment.

Aspects of the invention also encompass methods of forming conductive lines comprising at least one of nickel silicide or cobalt silicide. For example and by way of example only, FIGS. 5 and 6 depict a substrate fragment 25 comprising bulk semiconductive material 26. An exemplary preferred material 26 comprises monocrystalline silicon provided at a suitable background conductivity-enhancing doping, for example to be capable of functioning as a channel region of a transistor gate. Alternate substrates and structures are also contemplated, of course, with semiconductor-on-insulator substrates being but one alternate example. A trench 28 in the form of a desired line has been fabricated relative to substrate 26. An exemplary depth of trench 28 within material 26 is from 300 Angstroms to 2,000 Angstroms. In one implementation, an undoped silicon dioxide layer 30 has been formed over substrate 26 and within line trench 28. An exemplary preferred thickness range for layer 30 is from 500 Angstroms to 800 Angstroms. A silicon-comprising material 32 has been formed within trench 28 and can be considered as having opposing lateral sides 34 and 36. An exemplary preferred material 32 is intrinsic polycrystalline silicon (polysilicon) which has been deposited and planarized back relative to an outer surface of undoped silicon oxide layer 30, for example by chemical mechanical polishing. Such provides but one exemplary silicon-comprising line having undoped silicon dioxide received laterally over opposing sides thereof. In one exemplary preferred embodiment and as depicted, the nickel silicide-comprising line being formed will comprise a transistor gate line, and material 30 comprises a gate dielectric of a field effect transistor comprising such gate line.

Figure 7:
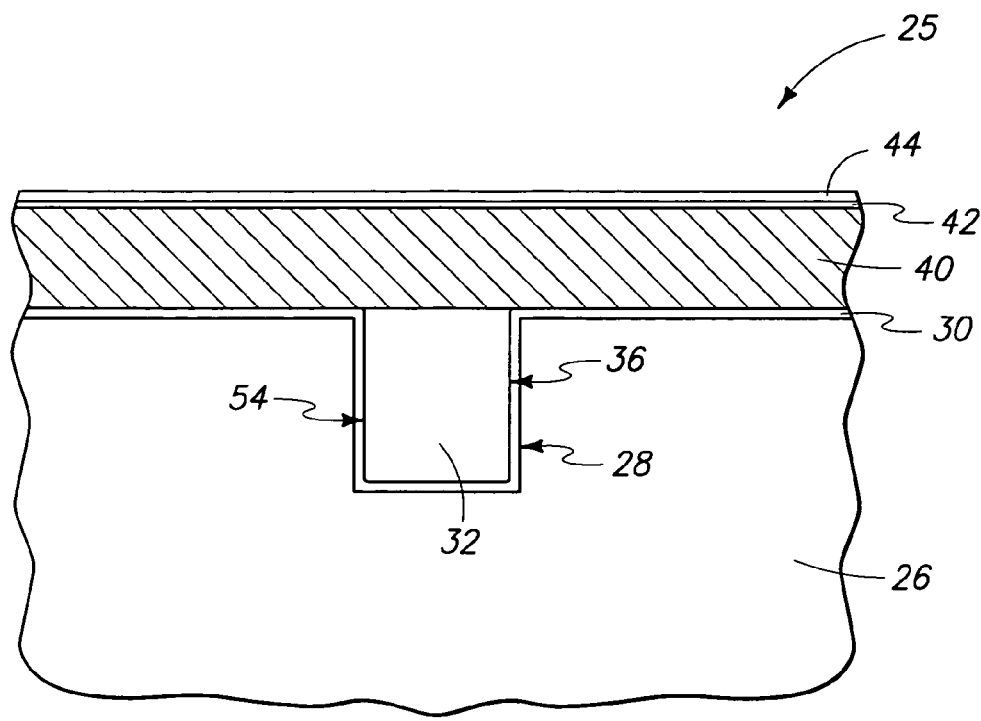
FIG. 7 is a view of the FIG. 5 substrate fragment at a processing step subsequent to that shown by FIG. 5.

Referring to FIG. 7, elemental nickel 40 has been deposited over silicon-comprising line 32 and over undoped silicon dioxide 30. An exemplary preferred thickness range for nickel 40 is from 50 Angstroms to 1,000 Angstroms. Preferably and further, a titanium layer 42 and a titanium nitride layer 44 have been formed over nickel 40. An exemplary preferred thickness range for layer 42 is from 50 Angstroms to 500 Angstroms, while that for layer 44 is from 50 Angstroms to 500 Angstroms. Layers 42 and 44 are preferably provided to reduce silicide agglomeration in an anneal described below.

Figure 8:
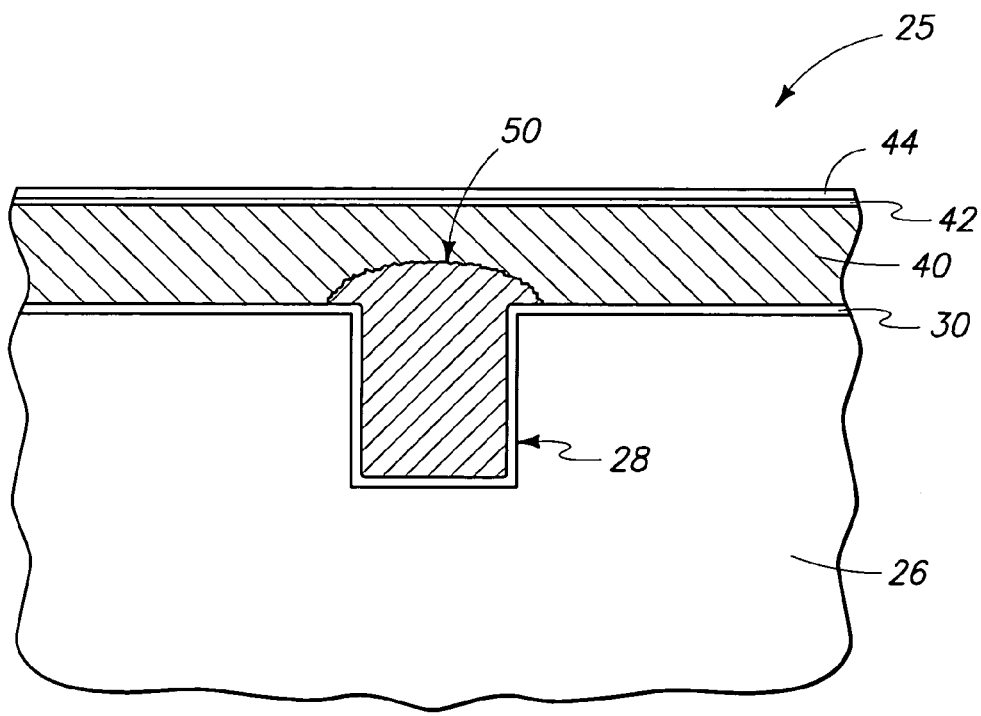
FIG. 8 is a view of the FIG. 7 substrate fragment at a processing step subsequent to that shown by FIG. 7.

Referring to FIG. 8, elemental nickel 40 and silicon of silicon-comprising line 32 (no longer shown) have been annealed effective to form a nickel silicide-comprising line 50. Such is depicted, in one preferred embodiment, as projecting outwardly of undoped silicon dioxide 30. Exemplary anneal conditions include a temperature of from 400° C. to 1,000° C. at a pressure from 350 Torr to 1100 Torr in an inert atmosphere.

Figure 9:
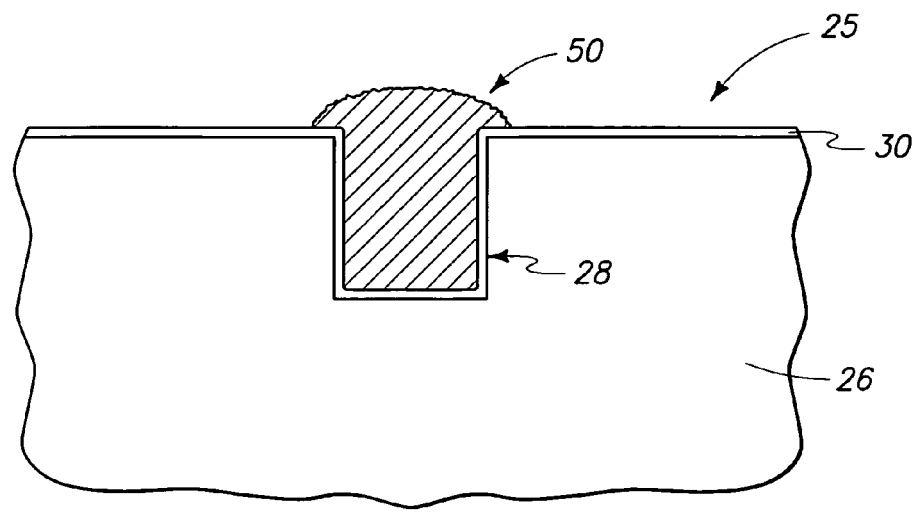
FIG. 9 is a view of the FIG. 8 substrate fragment at a processing step subsequent to that shown by FIG. 8.

Referring to FIG. 9, unreacted nickel, the Ti and the TiN have been removed from the substrate, preferably by etching. Exemplary chemistries include a mixture of $H_2SO_4$, $H_2O_2$ and $H_2O$, or a mixture of HCl, $H_2O_2$, and $H_2O$.

Figure 10:
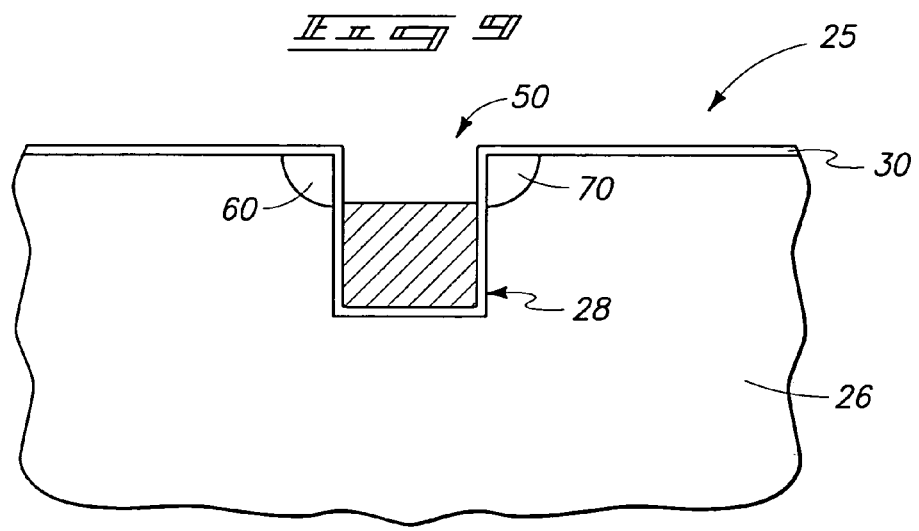
FIG. 10 is a view of the FIG. 9 substrate fragment at a processing step subsequent to that shown by FIG. 9.

Referring to FIG. 10, the nickel silicide of nickel silicide-comprising line 50 has been etched selectively relative to undoped silicon dioxide 30 using a fluid comprising $H_3PO_4$ and $H_2O_2$ at a temperature of at least 50° C. and at a pressure of from 350 Torr to 1100 Torr effective to recess the nickel silicide-comprising line 50 relative to undoped silicon dioxide 30. Processing is otherwise preferably as described above in connection with the etching of nickel silicide with $H_3PO_4$ and $H_2O_2$ in connection with the embodiments of FIGS. 1-4. A preferred degree/depth of etching of the nickel silicide-comprising material of line 50 is from 50 Angstroms to 1,500 Angstroms from the outermost surface of material 26 beneath undoped silicon dioxide 30. FIG. 10 also depicts, in one preferred embodiment, line 50 comprising a transistor gate line and the formation of source/drain regions 60 and 70 within preferred semiconductive material 26, thereby forming a transistor incorporating line 50. Such might be formed at this point in the process, or earlier or later in the process.

Figure 11:
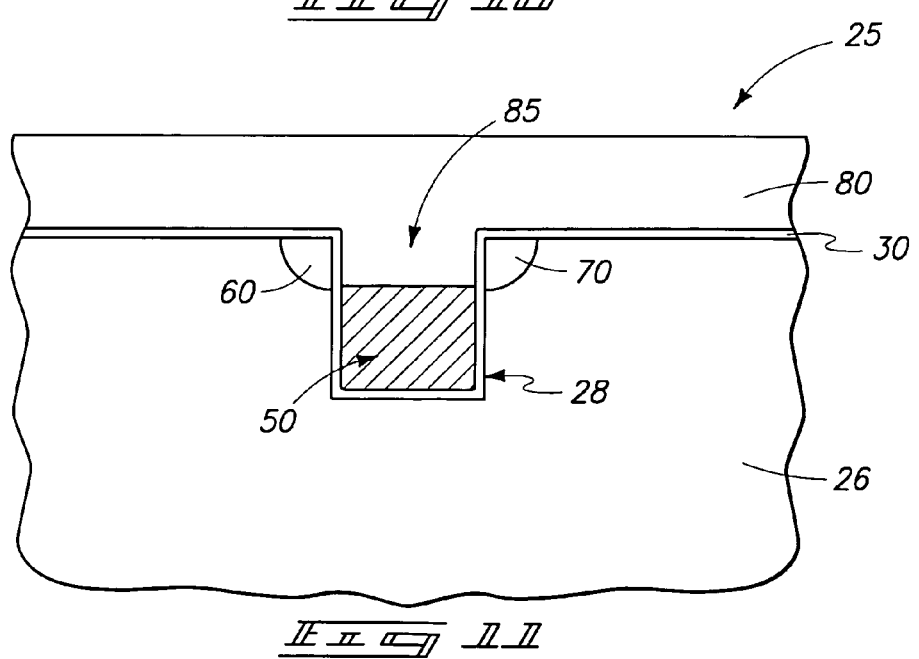
FIG. 11 is a view of the FIG. 10 substrate fragment at a processing step subsequent to that shown by FIG. 10.

Referring to FIG. 11, an electrically insulative material 80 has been deposited over the substrate. An exemplary preferred material comprises silicon nitride. Such thereby results in an exemplary insulative cap 85 being formed/received over transistor gate line 50 after such etching to form the gate line.

The invention also contemplates the fabrication of a conductive line comprising at least one of nickel silicide or cobalt silicide wherein etching occurs of such with a fluid-comprising $H_2SO_4$, $H_2O_2$, $H_2O$ and HF at a temperature of at least 50° C. and at a pressure of from 350 Torr to 1100 Torr, and selective to the at least one of silicon nitride or undoped silicon dioxide effective to recess such line relative to the at least one of silicon nitride or undoped silicon dioxide. Preferred processing is otherwise as described above in connection with the embodiment associated with etching at least one of nickel silicide or cobalt silicide with a fluid comprising $H_2SO_4$, $H_2O_2$, $H_2O$ and HF. For example and by way of example only, material 30 in the embodiment described in connection with FIGS. 5-11 might comprise at least one of silicon nitride or undoped silicon dioxide, and material 40 deposited thereover comprising at least one of elemental nickel or elemental cobalt. Such would be annealed, for example as described above, effective to form at least one of a nickel silicide-comprising line or a cobalt silicide-comprising line, for example as shown with line 50 in FIG. 8, and of course including a mixture of these materials. Processing could otherwise preferably occur as described in connection with FIGS. 9-11, wherein the etching of at least one of nickel silicide or cobalt silicide occurs with a fluid comprising $H_2SO_4$, $H_2O_2$, $H_2O$ and HF.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of etching nickel silicide comprising exposing a substrate comprising nickel silicide to a fluid comprising $H_3PO_4$ and $H_2O$ at a temperature of at least 50° C. and at a pressure from 350 Torr to 1100 Torr effective to etch nickel silicide from the substrate.

2. The method of claim 1 wherein the fluid predominantly comprises liquid.

3. The method of claim 1 wherein the temperature is at least 100° C.

4. The method of claim 3 wherein the temperature is from 135° C. to 155° C.

5. The method of claim 1 wherein the pressure is from 600 Torr to 900 Torr.

6. The method of claim 1 wherein the $H_3PO_4$ is present in the fluid at from 65 volume percent to 90 volume percent, and the $H_2O$ is present in the fluid at from 35 volume percent to 10 volume percent.

7. The method of claim 6 wherein the $H_3PO_4$ is present in the fluid at from 80 volume percent to 90 volume percent, and the $H_2O$ is present in the fluid at from 20 volume percent to 10 volume percent.

8. The method of claim 7 wherein the $H_3PO_4$ is present in the fluid at about 85 volume percent, and the $H_2O$ is present in the fluid at about 15 volume percent.

9. The method of claim 6 wherein the fluid consists essentially of $H_3PO_4$ and $H_2O$.

10. The method of claim 1 wherein the substrate comprises at least one of exposed undoped silicon dioxide or exposed elemental silicon during at least some portion of the etching, said etching being selective to said at least one of exposed undoped silicon dioxide or exposed elemental silicon.

11. The method of claim 10 wherein the selectivity to said at least one of exposed undoped silicon dioxide or exposed elemental silicon is at least 10:1.

12. The method of claim 11 wherein the selectivity to said at least one of exposed undoped silicon dioxide or exposed elemental silicon is at least 100:1.

13. The method of claim 10 wherein the substrate comprises exposed undoped silicon dioxide during at least some portion of the etching.

14. The method of claim 10 wherein the substrate comprises exposed elemental silicon during at least some portion of the etching.

15. A method of etching nickel silicide comprising:
    exposing a substrate comprising nickel silicide to a liquid comprising $H_3PO_4$ and $H_2O$ at a temperature of at least 100° C. and at a pressure from 600 Torr to 900 Torr effective to etch nickel silicide from the substrate, the $H_3PO_4$ being present in the liquid at from 65 volume percent to 90 volume percent, the $H_2O$ being present in the liquid at from 35 volume percent to 10 volume percent; and
    wherein the substrate comprises at least one of exposed undoped silicon dioxide or exposed elemental silicon during at least some portion of the etching, said etching being selective to said at least one of exposed undoped silicon dioxide or exposed elemental silicon.

16. A method of etching at least one of nickel silicide or cobalt silicide comprising exposing a substrate comprising at least one of nickel silicide or cobalt silicide to a fluid comprising $H_2SO_4$, $H_2O_2$, $H_2O$, and HF at a temperature of at least 50° C. and at a pressure from 350 Torr to 1100 Torr effective to etch the at least one of nickel silicide or cobalt silicide from the substrate.

17. The method of claim 16 wherein the etching is of nickel silicide.

18. The method of claim 16 wherein the etching is of cobalt silicide.

19. The method of claim 16 wherein the fluid predominantly comprises liquid.

20. The method of claim 16 wherein the temperature is at least 100° C.

21. The method of claim 16 wherein the pressure is from 600 Torr to 900 Torr.

22. The method of claim 16 wherein the fluid consists essentially of $H_2SO_4$, $H_2O_2$, $H_2O$, and HF.

23. The method of claim 16 wherein the HF is present in the fluid relative to a sum of the $H_2SO_4$, $H_2O_2$, and $H_2O$ at a volumetric ratio of from 0.0005:1 to 0.1:1.

24. The method of claim 23 wherein the volumetric ratio is from 0.001:1 to 0.002:1.

25. The method of claim 16 wherein the $H_2SO_4$ is present in the fluid relative to $H_2O_2$ at a volumetric ratio of from 20:1 to 40:1.

26. The method of claim 25 wherein the volumetric ratio is from 30:1 to 35:1.

27. The method of claim 16 wherein the $H_2O$ is present in the fluid relative to a sum of the $H_2SO_4$ and $H_2O_2$ at a volumetric ratio of from 0.03:1 to 1:1.

28. The method of claim 27 wherein the volumetric ratio is from 0.05:1 to 0.07:1.

29. The method of claim 16 wherein,
    the HF is present in the fluid relative to a sum of the $H_2SO_4$, $H_2O_2$, and $H_2O$ at a volumetric ratio of from 0.0005:1 to 0.1:1; and
    the $H_2SO_4$ is present in the fluid relative to $H_2O_2$ at a volumetric ratio of from 20:1 to 40:1.

30. The method of claim 16 wherein,
    the HF is present in the fluid relative to a sum of the $H_2SO_4$, $H_2O_2$, and $H_2O$ at a volumetric ratio of from 0.0005:1 to 0.1:1; and
    the $H_2O$ is present in the fluid relative to a sum of the $H_2SO_4$ and $H_2O_2$ at a volumetric ratio of from 0.03:1 to 1:1.

31. The method of claim 16 wherein,
    the $H_2SO_4$ is present in the fluid relative to $H_2O_2$ at a volumetric ratio of from 20:1 to 40:1; and
    the $H_2O$ is present in the fluid relative to a sum of the $H_2SO_4$ and $H_2O_2$ at a volumetric ratio of from 0.03:1 to 1:1.

32. The method of claim 16 wherein,
    the HF is present in the fluid relative to a sum of the $H_2SO_4$, $H_2O_2$, and $H_2O$ at a volumetric ratio of from 0.0005:1 to 0.1:1;
    the $H_2SO_4$ is present in the fluid relative to $H_2O_2$ at a volumetric ratio of from 20:1 to 40:1; and
    the $H_2O$ is present in the fluid relative to a sum of the $H_2SO_4$ and $H_2O_2$ at a volumetric ratio of from 0.03:1 to 1:1.

33. The method of claim 16 wherein the substrate comprises at least one of exposed undoped silicon dioxide, exposed elemental silicon, or exposed silicon nitride during at least some portion of the etching; said etching being selective to said at least one of exposed undoped silicon dioxide, exposed elemental silicon, or exposed silicon nitride.

34. The method of claim 33 wherein the selectivity to said at least one of exposed undoped silicon dioxide, exposed elemental silicon, or exposed silicon nitride is at least 10:1.

35. The method of claim 34 wherein the selectivity to said at least one of exposed undoped silicon dioxide, exposed elemental silicon, or exposed silicon nitride is at least 100:1.

36. The method of claim 33 wherein the substrate comprises exposed undoped silicon dioxide during at least some portion of the etching.

37. The method of claim 33 wherein the substrate comprises exposed elemental silicon during at least some portion of the etching.

38. The method of claim 33 wherein the substrate comprises exposed silicon nitride during at least some portion of the etching.

39. A method of etching at least one of nickel silicide or cobalt silicide comprising:
    exposing a substrate comprising at least one of nickel silicide or cobalt silicide to a liquid comprising $H_2SO_4$, $H_2O_2$, $H_2O$, and HF at a temperature of at least 50° C. and at a pressure from 600 Torr to 900 Torr effective to etch the at least one of nickel silicide or cobalt silicide from the substrate; wherein the HF is present in the liquid relative to a sum of the $H_2SO_4$, $H_2O_2$, and $H_2O$ at a volumetric ratio of from 0.0005:1 to 0.1:1, the $H_2SO_4$ is present in the liquid relative to $H_2O_2$ at a volumetric ratio of from 20:1 to 40:1, and the $H_2O$ is present in the liquid relative to a sum of the $H_2SO_4$ and $H_2O_2$ at a volumetric ratio of from 0.03:1 to 1:1; and wherein the substrate comprises at least one of exposed undoped silicon dioxide, exposed elemental silicon, or exposed silicon nitride during at least some portion of the etching; said etching being selective to said at least one of exposed undoped silicon dioxide, exposed elemental silicon, or exposed silicon nitride.

40. A method of forming a nickel silicide-comprising conductive line, comprising:
    forming a silicon-comprising line having undoped silicon dioxide received laterally over opposing sides thereof;
    depositing elemental nickel over the silicon-comprising line and over the undoped silicon dioxide;
    annealing the elemental nickel and silicon of the line effective to form a nickel silicide-comprising line; and
    etching the nickel silicide selectively relative to the undoped silicon dioxide using a fluid comprising $H_3PO_4$ and $H_2O$ at a temperature of at least 50° C. and at a pressure from 350 Torr to 1100 Torr effective to recess the nickel silicide-comprising line relative to the undoped silicon dioxide.

41. The method of claim 40 wherein the annealing forms the nickel silicide-comprising line to project outwardly of the undoped silicon dioxide.

42. The method of claim 40 wherein the nickel silicide-comprising line comprises a transistor gate line, and the undoped silicon dioxide comprises a gate dielectric of a field effect transistor comprising the gate line.

43. The method of claim 42 comprising:
    forming an electrically insulative cap over the transistor gate line after the etching; and
    forming source/drain regions of said field effect transistor laterally proximate the insulative cap.

44. A method of forming a conductive line comprising at least one of nickel silicide or cobalt silicide, comprising:
    forming a silicon-comprising line having at least one of silicon nitride or undoped silicon dioxide received laterally over opposing sides thereof;
    depositing at least one of elemental nickel or elemental cobalt over the silicon-comprising line and over the at least one of silicon nitride or undoped silicon dioxide;
    annealing the at least one of elemental nickel or the elemental cobalt and silicon of the line effective to form at least one of a nickel silicide-comprising line or a cobalt silicide-comprising line; and
    etching the at least one of a nickel silicide-comprising line or a cobalt silicide-comprising line with a fluid comprising $H_2SO_4$, $H_2O_2$, $H_2O$, and HF at a temperature of at least 50° C. and at a pressure from 350 Torr to 1100 Torr selective to the at least one of silicon nitride or undoped silicon dioxide effective to recess the at least one of a nickel silicide-comprising line or a cobalt silicide-comprising line relative to the at least one of silicon nitride or undoped silicon dioxide.

45. The method of claim 40 wherein the fluid predominantly comprises liquid.

46. The method of claim 40 wherein the temperature is at least 100° C.

47. The method of claim 40 wherein the $H_3PO_4$ is present in the fluid at from 65 volume percent to 90 volume percent, and the $H_2O$ is present in the fluid at from 35 volume percent to 10 volume percent.

48. The method of claim 47 wherein the fluid consists essentially of $H_3PO_4$ and $H_2O$.

49. The method of claim 40 wherein the selectivity to said undoped silicon dioxide is at least 10:1.

50. The method of claim 49 wherein the selectivity to said undoped silicon dioxide is at least 100:1.

51. The method of claim 44 wherein the annealing forms the at least one of the nickel silicide-comprising line or a cobalt silicide-comprising line to project outwardly of the undoped silicon dioxide.

52. The method of claim 44 wherein the at least one of a nickel silicide-comprising line or a cobalt silicide-comprising line comprises a transistor gate line, and the at least one of silicon nitride or undoped silicon dioxide comprises a gate dielectric of a field effect transistor comprising the gate line.

53. The method of claim 52 comprising:
    forming an electrically insulative cap over the transistor gate line after the etching; and
    forming source/drain regions of said field effect transistor laterally proximate the insulative cap.

54. The method of claim 44 wherein the etching is of nickel silicide.

55. The method of claim 44 wherein the etching is of cobalt silicide.

56. The method of claim 44 wherein the fluid predominantly comprises liquid.

57. The method of claim 44 wherein the fluid consists essentially of $H_2SO_4$, $H_2O_2$, $H_2O$, and HF.

58. The method of claim 44 wherein the HF is present in the fluid relative to a sum of the $H_2SO_4$, $H_2O_2$, and $H_2O$ at a volumetric ratio of from 0.0005:1 to 0.1:1.

59. The method of claim 44 wherein the $H_2SO_4$ is present in the fluid relative to $H_2O_2$ at a volumetric ratio of from 20:1 to 40:1.

60. The method of claim 44 wherein the $H_2O$ is present in the fluid relative to a sum of the $H_2SO_4$ and $H_2O_2$ at a volumetric ratio of from 0.03:1 to 1:1.

61. The method of claim 44 wherein the selectivity to said at least one of undoped silicon dioxide or silicon nitride is at least 10:1.

62. The method of claim 61 wherein the selectivity said at least one of undoped silicon dioxide or silicon nitride is at least 100:1.

* * * * *